United States Patent
Allen et al.

(10) Patent No.: US 7,124,387 B2
(45) Date of Patent: Oct. 17, 2006

(54) INTEGRATED CIRCUIT MACRO PLACING SYSTEM AND METHOD

(75) Inventors: Robert J. Allen, Jericho, VT (US); Steven G. Lovejoy, South Burlington, VT (US); Kevin W. McCullen, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 10/710,701

(22) Filed: Jul. 29, 2004

(65) Prior Publication Data

US 2006/0026545 A1    Feb. 2, 2006

(51) Int. Cl.
G06F 17/50    (2006.01)
(52) U.S. Cl. ............................................ 716/10; 716/9
(58) Field of Classification Search ............... 716/8–14
See application file for complete search history.

(56) References Cited

U.S. PATENT DOCUMENTS

| | | | |
|---|---|---|---|
| 4,908,772 A | 3/1990 | Chi | |
| 5,225,991 A | 7/1993 | Dougherty | |
| 5,579,237 A | 11/1996 | Shibuya | |
| 5,757,658 A * | 5/1998 | Rodman et al. | 716/10 |
| 5,814,846 A | 9/1998 | Essbaum et al. | |
| 5,930,151 A | 7/1999 | Uyama | |
| 5,953,236 A * | 9/1999 | Hossain et al. | 716/6 |
| 6,014,506 A * | 1/2000 | Hossain et al. | 716/11 |
| 6,457,163 B1 * | 9/2002 | Yang | 716/8 |
| 6,792,585 B1 * | 9/2004 | Ku et al. | 716/10 |
| 2001/0010090 A1 | 7/2001 | Boyle et al. | |
| 2003/0204829 A1 | 10/2003 | Bednar et al. | |
| 2004/0044979 A1 * | 3/2004 | Aji et al. | 716/13 |

FOREIGN PATENT DOCUMENTS

JP    200349160 A    12/2000

* cited by examiner

*Primary Examiner*—Thuan Do
*Assistant Examiner*—Binh Tat
(74) *Attorney, Agent, or Firm*—Downs Rachlin Martin PLLC

(57) ABSTRACT

A method (300) of placing a to-be-placed integrated circuit macro (404) adjacent one or more already-placed macros (400) aboard an integrated circuit chip (100). The method includes the step of performing a canonical ordering of the edges of the to-be-placed and already placed macros. Then, an edge constraint vector (500, 526) is generated for each active edge (668) of the already-placed macro(s) and each edge of the to-be-placed macro. Each of the edge constraint vectors of the to-be-placed macro is compared to each edge constraint vector of the active edge(s) using a string matching algorithm so as to determine whether any edges of the to-be-placed macro are compatible with any active edges of the already-placed macro(s). The method may be implemented in a CAD system (600).

11 Claims, 5 Drawing Sheets

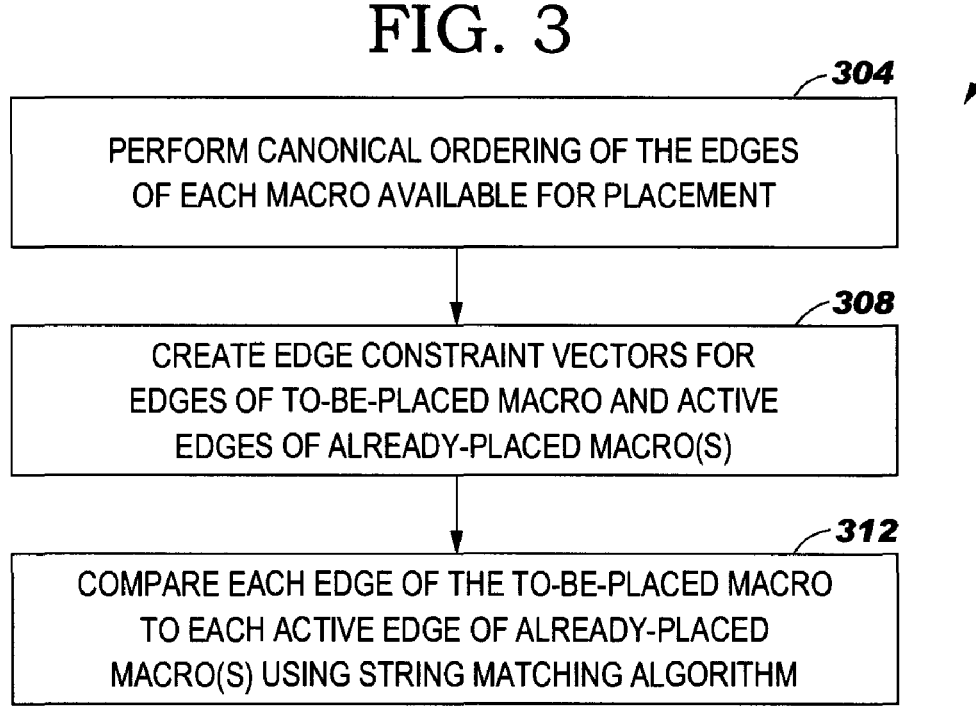
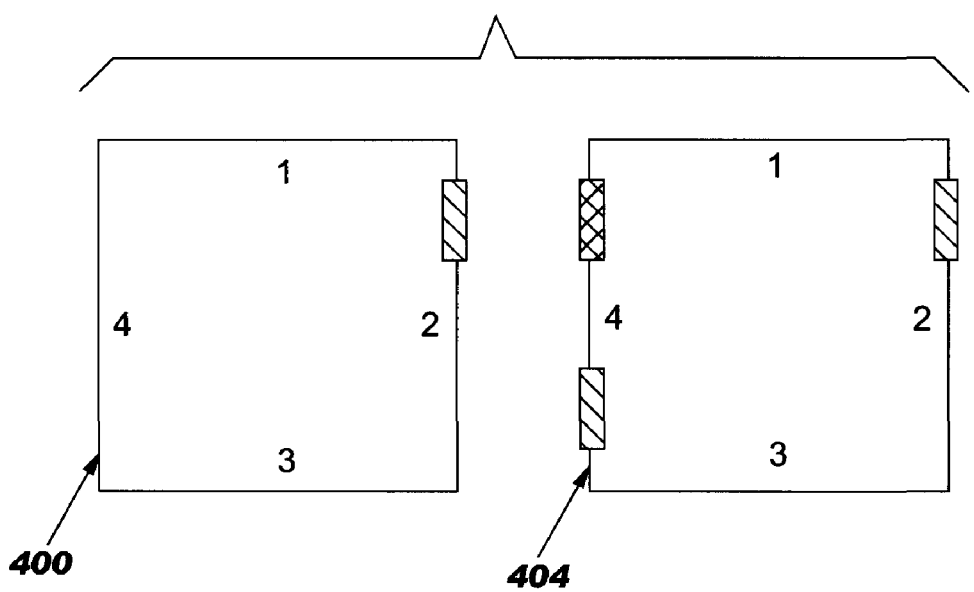

INTEGRATED CIRCUIT MACRO PLACING SYSTEM AND METHOD

BACKGROUND OF INVENTION

1. Field of the Invention

The present invention generally relates to the field of integrated circuits. In particular, the present invention is directed to an integrated circuit macro placing system and method.

2. Background of the Invention

The layout of many types of integrated circuit chips involves locating a plurality of pre-designed integrated circuit functional blocks, i.e., macros, aboard the chips. For example, for chips such as general microprocessor chips, macros are typically placed during the floor-planning phase of design, i.e., the phase in which the overall layout of the chip is performed. In this context, macros are generally arranged on the chips in spaced relationship with one another, with the wiring connecting the various macros to one another being essentially customized to the particular arrangement of macros resulting from the floor-planning phase.

At the opposite end of the floor-planning spectrum, many macros utilized in application-specific integrated circuits (ASICs) are often designed to be placed immediately adjacent one another so that immediately adjacent pairs of macros can share common wiring that connects the macros to the appropriate electrical networks, e.g., a power network (such as VDD), a ground network (GND) or a signal network, located on the various metal levels of the chip. In ASICs, the electrical networks are typically in the form of regular wiring grids that extend over the entire region(s) in which macros may be placed. Consequently, in the floor-planning phase of ASICs, many of the macros are simply placed side-by-side without the need to design custom power ground and signal wiring.

Between the two extremes just mentioned lies an intermediate design approach in which macros are not necessarily uniformly designed so as to be placed immediately adjacent any other macro as is typically done in ASIC design, but are also not necessarily incompatible with one another so as to require custom wiring. In this intermediate design approach, some macros may be configured so as to allow placement immediately adjacent one another so that they may share some common wiring to the electrical networks. However, there is presently not an efficient and effective way to determine if macros are compatible with one another so as to take advantage of ability to place them immediately adjacent each other and share common wiring.

SUMMARY OF INVENTION

In one aspect, the present invention is directed to a method of placing a first integrated circuit macro in a floor plan containing at least one second integrated circuit macro. The method comprises the steps of: a) defining edge constraints on at least one edge of the first integrated circuit macro; b) defining edge constraints on at least one edge of the second integrated circuit macro; and c) automatically comparing the edge constraints on the at least one edge of the first integrated circuit macro and the edge constraints on the at least one edge of the second integrated circuit macro with one another. In another aspect, the present invention is directed to a computer readable medium containing computer executable instructions implementing a method of placing a first integrated circuit macro in a floor plan containing at least one second integrated circuit macro. The instructions comprise a first set of instructions for defining edge constraints on at least one edge of the first integrated circuit macro and defining edge constraints on at least one edge of the second integrated circuit macro. A second set of instructions is for comparing the edge constraints on the at least one edge of the first integrated circuit macro and the edge constraints on the at least one edge of the second integrated circuit macro with one another.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 3 is a flow-diagram illustrating a macro-placement method of the present invention.

FIG. 4A is a high-level plan view of a pair of macros that may be placed using a system and method of the present invention;

DETAILED DESCRIPTION

Figure 1:
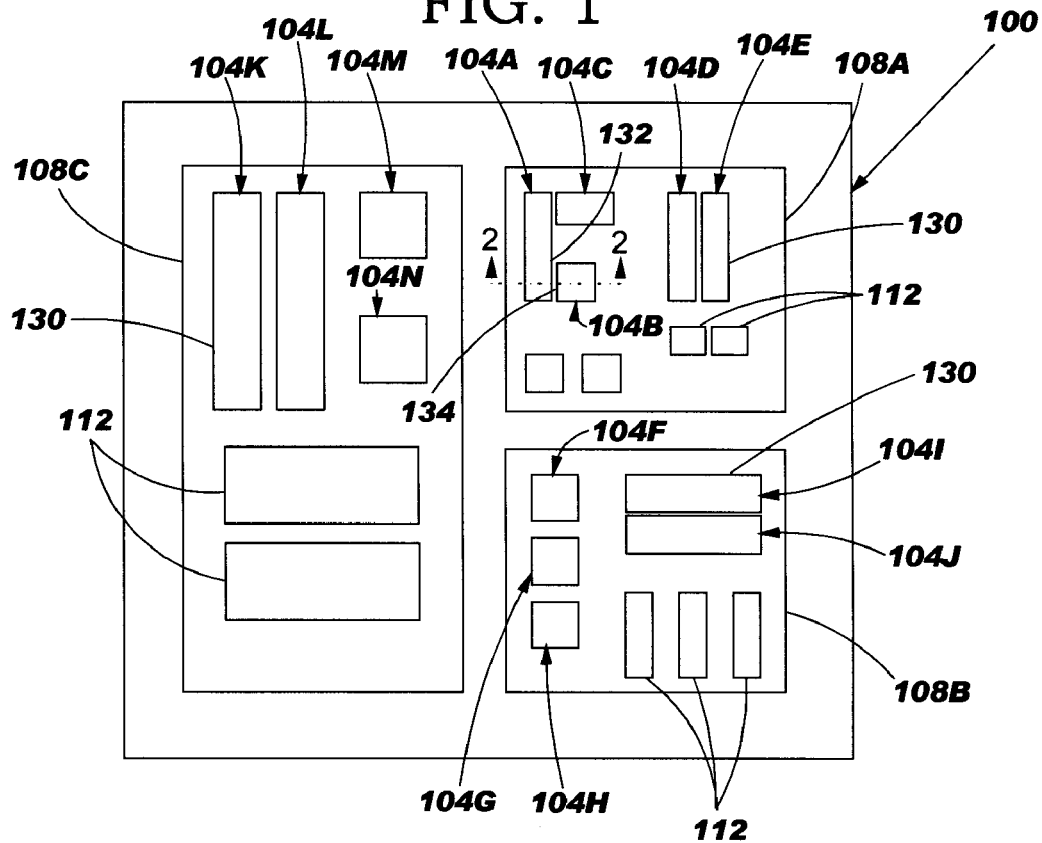
FIG. 1 is a floor plan view of an integrated circuit chip containing a plurality of macros placed using a system and method of the present invention.
Figure 2:
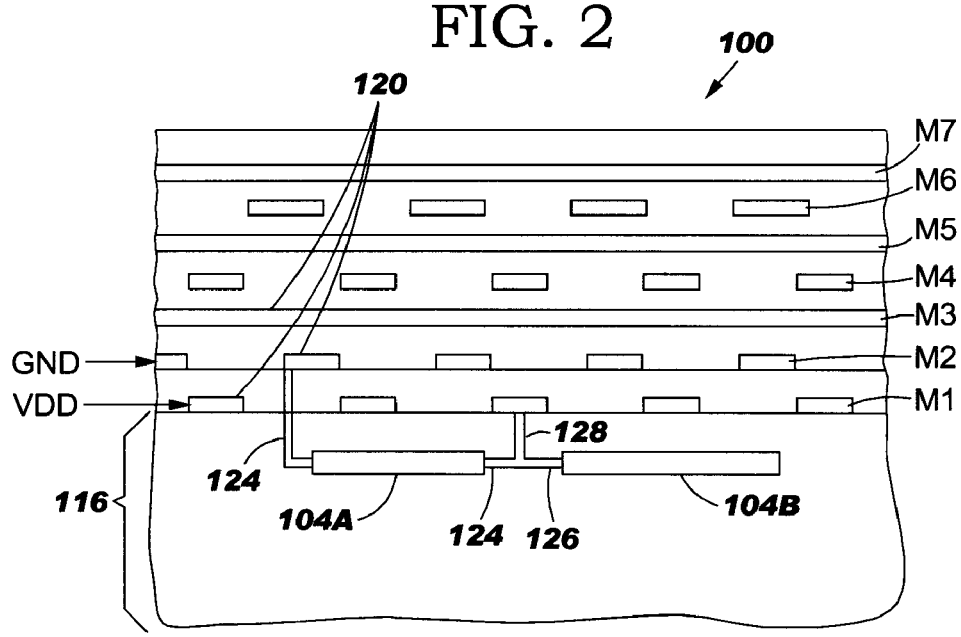
FIG. 2 is an enlarged cross-sectional view of the integrated circuit chip of FIG. 1 as taken along line 2—2.

Referring now to the drawings, FIGS. 1 and 2 illustrate an integrated circuit chip 100 having a plurality of macros 104A–104N placed using a macro placement system and method of the present invention. One embodiment of a macro placement system and one embodiment of a macro placement method are described below in detail. However, in order to provide a context for the macro placement system and method of the present invention, chip 100 is described first.

Chip 100 may be any type that utilizes a plurality of macros, e.g., macros 104A–104N, that are neither fully incompatible with one another so as to require custom wiring in every instance nor fully compatible with one another such that macros may be placed essentially without regard to wiring considerations. Chip 100 may be of any type, e.g., processor, memory, system on chip or controller, among others. Those skilled in the art will readily appreciate that chip 100 may be designed to perform any functions typical of integrated circuits and that the type of chip is generally not relevant to the broad scope of the present invention. As discussed in the background section above, such macros may or may not be compatible with one another so as to share common wiring. Thus, in order to place macros in a manner that minimizes wiring, it is necessary to determine whether or not various ones of macros are compatible with one another so that certain wiring may be shared.

Chip 100 may include one or more regions, such as regions 108A–108C, containing macros 104A–104N and other integrated circuitry 112. If a plurality of regions are used, each region may be largely dedicated to macros and other circuitry of a certain type. For example, region 108A may contain macros 104A–104E and/or other circuitry 112 corresponding to memory and memory functions, region 108B may contain macros 104E–104J and/or other circuitry 112 corresponding to logic and associated functions, and region 108C may contain macros 104K–104N and/or other circuitry 112 corresponding to external communications and associated functions. Of course, chip 100 need not be organized so, but rather may have macros 104A–104N and/or other circuitry 112 placed throughout a single region in a more distributed fashion.

Regardless of how macros 104A–104N and other integrated circuitry 112 are arranged aboard chip 100, the chip will typically include a device region 116 (FIG. 2) that includes the various electronic devices (not shown), e.g., transistors, capacitors, resistors, etc. that form macros 104A–104N and other circuitry 112. Device region 116 will typically include a substrate (not shown) and a plurality of semiconducting, conducting, superconducting and/or insulating layers and regions (not shown) that form the electronic devices and intra-macro electrical connections. Chip 100 will also typically include a plurality of metal levels, e.g., metal levels M1–M7, each containing wiring 120 for one or more of the electrical networks that provide 1) power to the macros and circuitry (e.g., VDD), 2) a ground (GND) for the macros and circuitry, 3) inter-macro signal pathways (not shown) and 4) chip I/O pathways (not shown), among others. Those skilled in the art will readily understand the many ways in which device region 116 and metal levels M1–M7 may be configured and arranged such that a detailed explanation of them is not necessary for those skilled in the art to understand how to make and use the present invention.

Depending on their functionality and design, each macro 104A–104N will typically need to be electrically connected to one or more of the electrical networks provided on metal levels M1–M7. For example, macro 104A may be electrically connected to network GND on metal level M2 by connector 122 and to network VDD on metal level M1 by connector 124, and macro 104B may be electrically connected to network VDD on metal level M1 by connector 126, which may merge with connector 124 to form a common connector 128. Macros, such as macros 104A–104N, may each be considered to be bounded by a fictitious boundary rectangle 130 having four "edges". In addition, the various connectors 122, 124, 126, e.g., connectors, used to connect the macros to the necessary metal level(s) typically extend to or through boundary rectangle 130 on one of the edges thereof.

As shown, macros 104A, 104B share common electrical connector 128 to network VDD on metal level M1 along edges 132, 134, respectively. This placement was made using a macro placement system and method of the present invention. If macros 104A, 104B were not placed as shown, two electrical connectors 124, 126 would generally be necessary to connect the two macros to network VDD on metal level M1. That is, common connector 128 could not be implemented. For example, if macro 104A had been placed in the same location but in its mirror image form (relative to FIG. 2) such that edge 136 of macro 104A confronted edge 134 of macro 104B, connector 120 of macro 104A to network GND would be located adjacent connector 126 of macro 104B to network VDD. Since the purposes of these connectors 122, 126 conflict with one another, they need to remain separate between their respective macros 104A, 104B and electrical networks VDD, GND.

FIG. 3 illustrates a macro placing method 300 of the present invention. Generally, macro placing method 300 involves comparing physical constraints, e.g., electrical connector shapes and types, along each active edge of one or more already-placed macros, e.g., macro 400 of FIG. 4A, to similar physical constraints on each edge of a to-be-placed macro, e.g., macro 404 of FIG. 4A, so as to determine whether or not the physical edge constraints of the to-be-placed macro are compatible with any of the active edges of the already placed macro(s) so that the to-be-placed macro may be placed immediately adjacent an already-placed macro.

As used herein and in the appended claims, the term "active edge" and similar terms means that the edge so denoted is available for receiving another macro immediately adjacent thereto. Whether or not an edge is an "active edge" may be determined in one or more of a variety of ways. For example, any edge of an already-placed macro may be deemed an active edge as long as another macro does not already occupy the spaces immediately adjacent that edge. Alternatively, active edges may be designated by a user. For example, in a computer-aided design (CAD) system, e.g., CAD system 600 of FIG. 6, having a graphical user interface (GUI), a user may select edges that are to be active edges using a conventional or other selecting technique, such as "pointing and clicking" using a suitable input device, e.g., a computer mouse. It is noted that certain edges, although not having other macros immediately adjacent them, may be prevented from being an active edge. For example, if there is insufficient room in a floor plan to accept another macro adjacent a certain edge, that edge may never be permitted to be an active edge. This concept may be extended to base the decision of whether or not an edge may be an active edge on which macro is selected as the to-be-placed macro, and even a particular orientation of a macro. For example, some macros are elongate and may fit between an already-placed macro and an edge of a floor plan only in one orientation of the long axis.

In determining edge compatibility, a to-be-placed macro may be mirrored or rotated, or both, so that for each active edge of the one or more already-placed macros, compatibility of the to-be-placed macro may be determined by assessing that edge against eight edge configurations of the to-be-placed macro, i.e., each of the four edges of the to-be-placed macro in both its "normal" orientations and reverse orientation. As discussed below, macro placing method 300 may utilize a pattern matching algorithm to determine the edge compatibility between active edges of the one or more already-placed macros and edges of to-be-placed macros.

At step 304, a canonical ordering of the edges of each macro available for placement may be made. This canonical ordering may be any ordering desired, such as the clockwise ordering shown in FIG. 4A in which the "upper" edges of macros 400, 404 are each designated edge 1, "right-side" edges are each designated edge 2, "bottom" edges are each designated edge 3 and "left-side" edges are each designated edge 4. Of course, another ordering may be used, such as counterclockwise ordering.

Figure 4B:
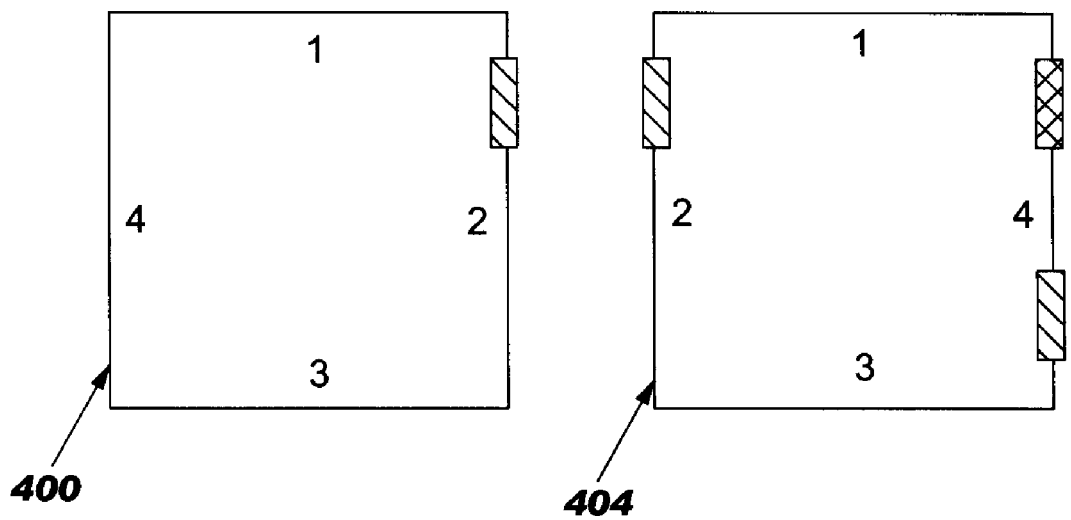
FIG. 4B is a high-level plan view of a legal placement of the macros of FIG. 4A relative to one another.
Figure 5A:
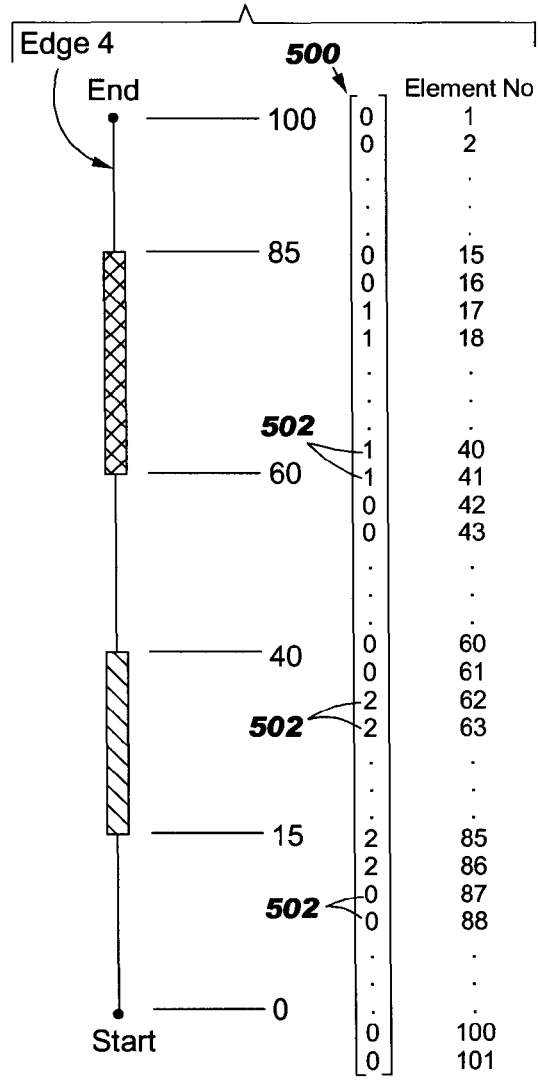
FIG. 5A shows a constraint vector corresponding to edge 4 of the to-be-placed macro of FIG. 4A.

Referring again to FIG. 3, and also to FIGS. 4A and 5A, at step 308 an edge constraint vector, e.g., edge constraint vector 500 of FIG. 5A, may be created for each active edge of each already-placed macro 400 and each edge of selected to-be-placed macro 404. Generally, each edge constraint vector 500 contains a representation of the edge constraints along a corresponding edge of already-placed macro 400 or to-be-placed macro 404. Referring to FIG. 5A, in one embodiment, each edge constraint vector 500 contains sets of signatures 502, e.g., numerals, representing both the type of constraint (or lack of constraint where no constraint is present), e.g., an electrical connection to VDD on metal level M1, and length of each constraint (or the length of an unconstrained region). The type of edge constraint may be designated by a signature 502 unique to each type of constraint. For example, each unit within a region having a lack of constraint may be designated by the numeral "0," each constraint of VDD on metal level M1 may be designated by the numeral "1," each constraint of GND on metal level M2 may be designated by the numeral "2," and so on for each type of constraint present along the edges under consideration.

The lengths of the constraints along each edge at issue may be represented by first selecting a unit of length that will be used to measure all edges and all constraints of the macros 400, 404 at issue and assigning a constraint signature, e.g., a numerical value, to each unit, wherein the constraint signature assigned to a unit depends upon the type of constraint present at that location. For example, in FIG. 5A, the length of edge 4 is 100 units, such that edge constraint vector 500 has a length of 101 elements, i.e., the number of numerals from 0 to 100 inclusive. From 0 to 15 no constraint is present, such that, in accordance with the signature designations enumerated above, elements 1–16 of edge constraint vector 500 each contain a "0." Similarly, from 15–40 a constraint of the type VDD on metal level M1 is present. Correspondingly, elements 17–41 of edge constraint vector 500 each contain a "1." Likewise, from 40–60 no constraint is present, such that elements 42–61 of edge constraint vector each contain a "0," from 60–85 a constraint of the type GND on metal level M2 is present, such that elements 62–86 of edge constraint vector each contain a "2," and from 85–100 no constraint is present, such that elements each contain a "0." Each edge under consideration is "vectorized" in the same manner using the same measure of length. Using a common measure of length for all macros allows edge constraint vectors to be compared with one another so as to determine the compatibility of edges with one another. The unit of measure selected is generally pertinent only to the desired level of fineness needed to determine edge compatibility. The unit of measure may be a standardized unit of measure, such as a micron, or any other suitable unit of measure.

Figure 5B:
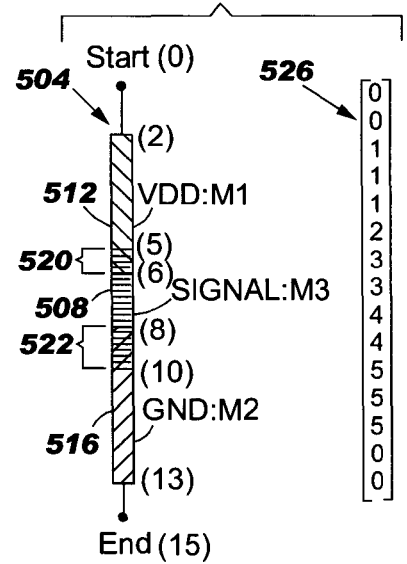
FIG. 5B shows an edge constraint vector for an edge having overlapping constraints.

It is noted that, depending upon the design of a macro, one or more of the edges of that macro may have two or more edge constraints that overlap one another. For example, edge 504 shown in FIG. 5B has a "SIGNAL on metal level M3" constraint 508 that overlaps each of a "VDD on metal level M1" constraint 512 and a "GND on metal level M2" constraint 516 so as to form constraint overlaps 520, 522. In this example, each unique overlap 520, 522 may be assigned its own signature. For example, all units within regions of no constraint may be designated with the signature "0," all units within constraint 512 may be designated with the signature "1," all units within constraint overlap 520 may be designated with the signature "2," all units within constraint 508 may be designated with the signature "3," all units within constraint overlap 522 may be designated with the signature "4" and all units within constraint 516 may be designated with the signature "5." Then, if these constraints and edge 504 have the lengths shown in FIG. 5B, the corresponding edge constraint vector 526 may be as shown in FIG. 5B. Those skilled in the art will readily appreciate how to extrapolate the present relatively simplistic examples to more complex edge constraint conditions.

Figure 5C:
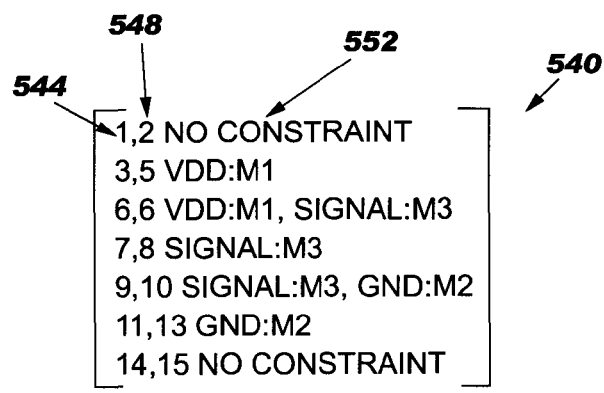
FIG. 5C illustrates a compact edge constraint definition for the edge and edge constraint vector of FIG. 5B.

Depending upon the lengths of edge constraint vectors, e.g., edge constraint vector 500 and the number of edges that need to be vectorized, the memory requirements needed to store all of these vectors and/or the processing time needed to assemble these vectors may be considerations in implementing macro placement method 300. If either or both of these considerations becomes a concern, edge constraint vectors 500 may be stored in a compact edge constraint definition until needed. Then, when certain edge constraint vectors 500 are needed based upon the one or more active edges of the one or more already-placed macros 400 and the to-be-placed macro 404 selected, the compact constraint definitions for these edges may be used to construct the corresponding edge constraint vectors. FIG. 5C illustrates one form of a compact constraint definition 540 of the present invention. Compact constraint definition 540 corresponds to edge 504 and edge constraint vector 526 of FIG. 5B. As seen, compact constraint definition 540 may include for each constraint (and unconstrained region) a start point 544, an end point 548 and a description of the constraint 552, e.g., the name of the electrical network(s) and corresponding metal layer(s). Those skilled in the art will readily appreciate that there are many algorithms for expanding compact constraint definition 540 into edge constraint vector 526 and will readily understand how to implement such algorithms such that a detailed explanation is not necessary for those skilled in the art to make and use the present invention to its fullest scope as defined by the appended claims.

As shown in FIG. 3, at step 312 each edge of to-be-placed macro 404 (FIG. 4A) may be compared to each active edge of already-placed macro 400 (FIG. 4A), e.g., using a string matching algorithm that compares each edge constraint vector 500 (FIG. 5A) of the to-be-placed macro to each edge constraint vector of the active edges at issue. String matching algorithms are very well known in the art and do not need to be described in any detail herein for those skilled in the art to make and use the present invention. Generally, the string matching algorithm looks for matches via signatures 502 (FIG. 5A) between edge constraints on edges of to-be-placed macro 404 with edge constraints on active edge(s) of already-placed macro(s) 400. For example, referring to FIG. 4A, for this illustration it is assumed that edge 2 of already-placed macro 400 is the sole active edge. Edge 2 of already-placed macro 400 may be represented, from upper end to lower end, by the edge constraint vector [0 1 1 1 0 0 0 0 0 0 0], wherein signature "0"designates no constraint and signature "1" designates VDD on metal level M1. Similarly, edge 4 of to-be-placed macro 404 may be represented, from lower end to upper end, by the edge constraint vector [0 2 2 2 0 0 0 1 1 1 0], wherein signature "2" designates GND on metal level M2 and signatures "0" and "1" again designate, respectively, no constraint and VDD on metal level M1. Table I, below, shows the edge constraint vectors for active edge 2 of already-placed macro 400 and each of edges 1–4 of to-be-placed macro 404 in their "normal," i.e., forward order.

TABLE I

| Already-Placed Macro | To-Be-Placed Macro (forward order) | | | |
|---|---|---|---|---|
| Edge 2 | Edge 1 | Edge 2 | Edge 3 | Edge 4 |
| 0 | 0 | 0 | 0 | 0 |
| 1 | 0 | 1 | 0 | 2 |
| 1 | 0 | 1 | 0 | 2 |
| 1 | 0 | 1 | 0 | 2 |
| 0 | 0 | 0 | 0 | 0 |
| 0 | 0 | 0 | 0 | 0 |
| 0 | 0 | 0 | 0 | 0 |
| 0 | 0 | 0 | 0 | 1 |
| 0 | 0 | 0 | 0 | 1 |
| 0 | 0 | 0 | 0 | 1 |
| 0 | 0 | 0 | 0 | 0 |

Table II, below, shows the edge constraint vectors for active edge 2 of already-placed macro 400 and each of edges 1–4 of to-be-placed macro 404 in their reverse order.

TABLE II

| Already-Placed Macro | To-Be-Placed Macro (reverse order) | | | |
|---|---|---|---|---|
| Edge 2 | Edge 1 | Edge 2 | Edge 3 | Edge 4 |
| 0 | 0 | 0 | 0 | 0 |
| 1 | 0 | 0 | 0 | 1 |
| 1 | 0 | 0 | 0 | 1 |
| 1 | 0 | 0 | 0 | 1 |
| 0 | 0 | 0 | 0 | 0 |
| 0 | 0 | 0 | 0 | 0 |
| 0 | 0 | 0 | 0 | 0 |
| 0 | 0 | 1 | 0 | 2 |
| 0 | 0 | 1 | 0 | 2 |
| 0 | 0 | 1 | 0 | 2 |
| 0 | 0 | 0 | 0 | 0 |

The foregoing Tables I and II represent all possible comparisons that may be made of edges 1–4 of to-be-placed macro 404 to edge 2 of already-placed macro 400. From these tables it is seen that the only exact match between edge constraint vectors of edges 1–4 of to-be-placed macro and edge 2 of already-placed vector is for edge 2 of the to-be-placed macro in its normal, or forward, order. Thus, if the matching criteria is exact matching, the only legal placement of to-be-placed macro 404 is immediately adjacent edge 2 of already-placed macro 400, with the to-be-placed macro flipped horizontally. This is shown in FIG. 4B. It is noted that rules for determining the to-be-placed macro 404 should be flipped horizontally or vertically and/or rotated are easily made once a canonical ordering of the edges has been selected and applied. For example, from the immediately foregoing illustration, it is readily seen that if the string of signatures in the edge constraint vectors of edges 2 of already-placed and to-be-placed macros 400, 404 match in their normal order, then the to-be-placed macro must be flipped horizontally. However, if the match between edges 2 of already-placed and to-be-placed macros 400, 404 had been between the edge constraint vector of edge 2 of the to-be-placed macro in its reverse order and the edge constraint vector of edge 2 of the already-placed macro, then it is readily seen that the to-be-placed macro would have to be rotated 1800 to be in its legal orientation relative to edge 2 of the already-placed macro. It is easily seen that other rules will apply depending upon which edge(s) of to-be-placed macro 404 match which active-edge(s) of already-placed macro(s) 400 and the orientation(s) of the already-placed macro(s). Deriving these rules is a straightforward task that is well within the ordinary level of skill of the relevant artisans.

Figure 4C:
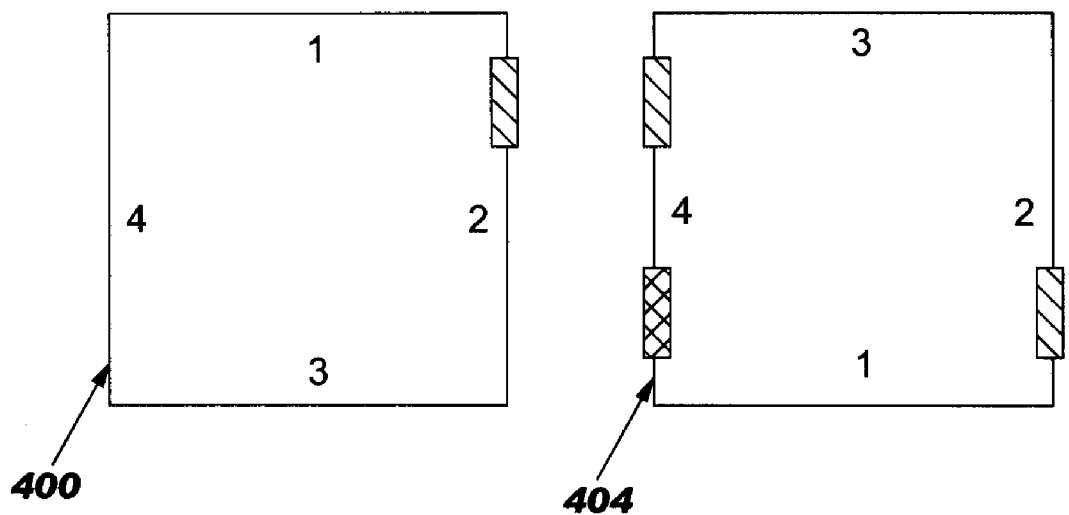
FIG. 4C is a high-level plan view of an alternative legal placement of the macros of FIG. 4A.

In other embodiments, matching need not be exact. For example, regions containing no constraints (signature "0" in the preceding example) may be legally placed immediately adjacent edge constraints (signatures "1" and "2"), since there is technically no interference between two or more actual physical constraints of different types, e.g., as in a constraint having a signature "1" confronting a constraint having a signature "2." That is, a region of no constraint does not have any actual physical constraints. Thus, it is readily seen from FIGS. 4A–4C and Tables I and II above that the only illegal placement of to-be-placed macro 404 is the placement shown in FIG. 4A, wherein there is indeed a physical conflict between constraint VDD:M1 of edge 2 of already-placed macro 400 and constraint GND:M2 of edge 4 of to-be-placed macro 404 in its normal order. In any of the other seven possible placements, either constraint VDD:M1 of edge 2 of already-placed macro 400 would abut a similar VDD:M1 edge constraint on to-be-placed macro 404 or a region of no constraint on the to-be-placed macro. That said, a placement wherein similar edge constraints do not abut one another but would if to-be-placed macro 404 were in a different orientation may not be desirable, since the benefits of such abutment, e.g., common connectors and better space utilization, will not be exploited. For example, placing to-be-placed macro 404 adjacent edge 2 of already-placed macro such that either edge 1 or edge 3 of the to-be-placed macro abuts edge 2 of the already-placed macro would not be as efficient as either of the two placements shown in FIGS. 4B and 4C.

It is noted that other non-exact matching schemes may be alternatively, or additionally, implemented. For example, segments having the same signatures need not have the same physical lengths and/or may only partially overlap one another. Thus, e.g., it may be legal to abut a short VDD:M1 edge constraint to a long VDD:M1 constraint, or abut two GND:M2 edge constraints that 50% overlap with one another. Those skilled in the art will readily appreciate the various matching schemes that may be implemented and readily understand how to implement various string matching algorithms to implement these schemes.

In addition, the foregoing examples are based on already-placed and to-be-placed macros 400, 404 (FIG. 4A) having edges all of the same length. However, a macro-placement method of the present invention, e.g., macro-placement method 300 of FIG. 3 can easily be implemented with macros having different shapes and/or edges of different lengths. For example, when determining the compatibility of a short edge of a to-be-placed macro (not shown) with a long edge of an already-placed macro (not shown), the short-edge edge constraint vector of the to-be-placed macro may be match-searched against the entire length of the long-edge edge constraint vector of the already-placed macro, e.g., using a known string-searching algorithm, in order to determine all legal matches of the short-edge edge constraint vector to the long-edge edge constraint vector. Depending upon the constraints present on the two edges, the result of the matching may be the placement of the to-be-placed macro, e.g., at a one-third point, middle or other location, along the long edge of the already-placed macro. Those skilled in the art will readily understand how to implement a string matching algorithm to implement matching algorithms for edges of different lengths.

Figure 6:
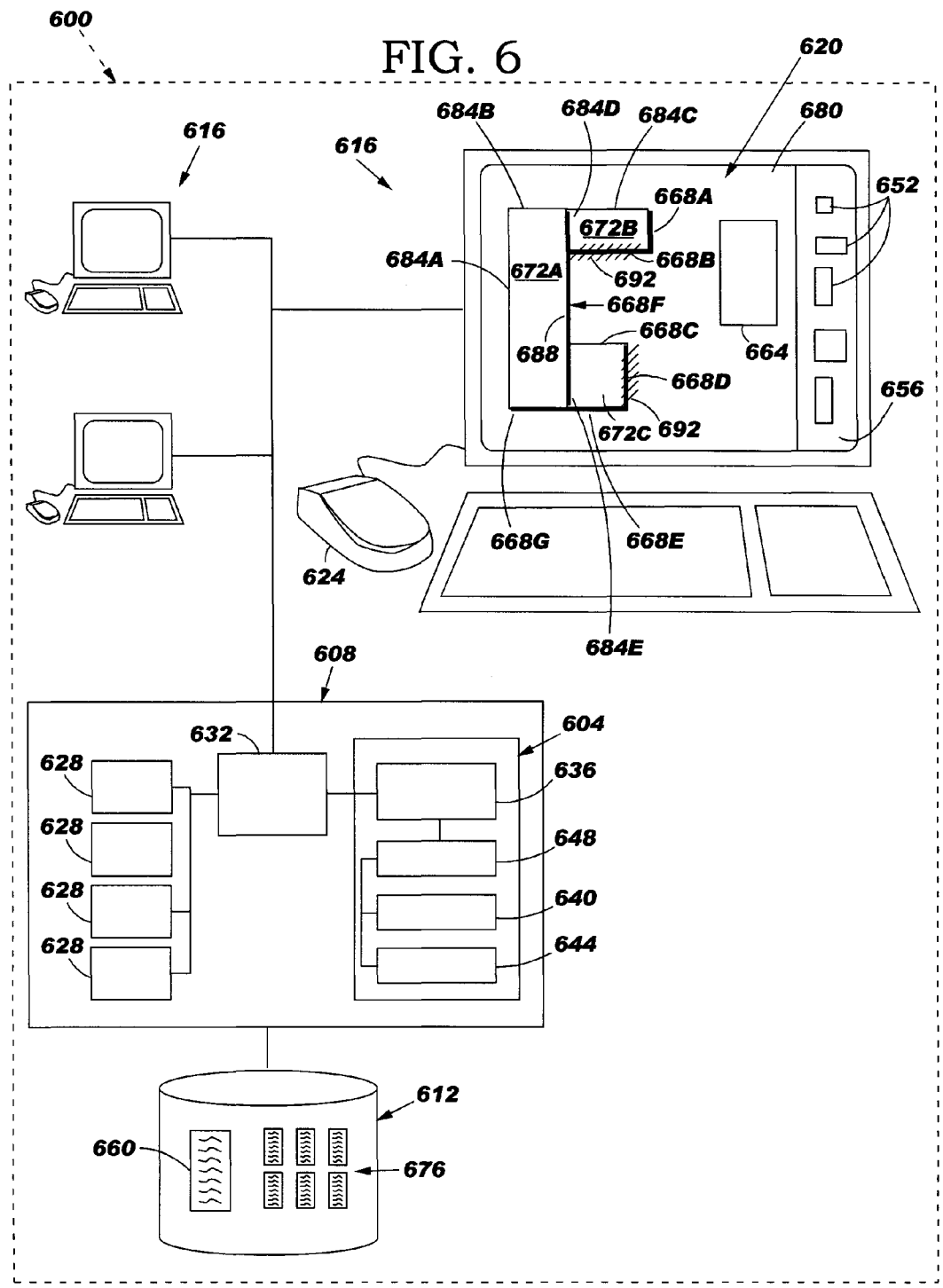
FIG. 6 is a partial high-level schematic diagram of a macro-placement system of the present invention.

FIG. 6 shows a CAD system 600 of the present invention that incorporates a macro placing module 604 operatively configured to place macros using a macro placing method the same as or similar to macro-placing method 300 described above in connection with FIGS. 3, 4A–4C and 5A–5C. It is noted that the term "module" and like terms are used herein and in the appended claims for convenience to denote functionality and not necessarily a physical or software module, although these modules are encompassed in the definition of "module" as long as they provide the requisite functionality. Consequently, macro placing module 604 may, in implementation, comprise computer instructions arranged in one or more groups, such as an application program, an application program plug-in or module, routines, and/or subroutines, among others.

CAD system 600 may also include, among other things, CAD software 608, a database 612 and one or more workstations 616 that allows a user (not shown) to utilize the functionality of the software, e.g., using a GUI 620 that permits the user to interact with the software using any one or more of a variety of input devices, such as a mouse 624, trackball, keyboard, digitizer, etc. CAD software 608 may include one or more conventional CAD modules 628 that provide conventional CAD functions, such as circuit placement, wiring compacting, design rule checking, etc., and a user interface module 632 that, essentially, drives each GUI 620. Macro placing module 604 may include, among other things, a user interface sub-module 636, an edge constraint defining sub-module 640, an edge constraint vectorizing sub-module 644 and a placing sub-module 648. User interface sub-module 636 may provide any additional functionality to user interface module 632 that macro placing module 604 uses but the conventional user interface module does not include. Edge constraint defining sub-module 640 may be operatively configured to define the edge constraints of all of the various types of macros 652 that can be placed using placing sub-module 648. Macros 652 may be displayed, e.g., in an "available macros" region 656 of GUI 620. The output of edge constraint defining sub-module 640 may be a list of edge constraint definitions for all edges of available macros 652 as defined in a canonical order. This list 660 of edge constraint definitions may be stored in database 612. The edge constraint definitions may, if desired, be in a form similar to edge constraint definitions 540 of FIG. 5C. Edge constraint vectorizing sub-module 644 may be operatively configured to vectorize the ones of edge constraint definitions needed when a particular to-be-placed macro 664 is about to be placed. In one embodiment, the edge constraint definitions needed may be all of the edge constraint definitions of to-be-placed macro 664 and all of the edge constraint definitions of the active edges 668A–G of the one or more already-placed macros 672A–672C. The determination of which one of available macros 652 a user has selected as the to-be-placed macro 664 and which edges of already placed macro(s) 672A–672C may be made by placing sub-module 648. The output of edge constraint vectorizing sub-module 644 may be a plurality of edge constraint vectors 676, which may be stored in database 612 or other memory location.

Placing sub-module 648 may be provided with a host of functions that allow a user to quickly determine all legal locations of a selected to-be-placed macro 664 and then make a legal placement. Following is a description of an exemplary set of functions of placing sub-module 648. It is noted that those having ordinary skill in the art will readily understand how to implement these functions in a placing sub-module according to the present invention. In addition, skilled artisans will easily be able to implement additional and/or alternative functions that flow from the broad concepts of the present invention.

This example assumes that three macros 672A–672C have already been placed within a floor plan region 680 of GUI 620 and that, of the twelve edges of these three modules, seven edges are active, i.e., edges 668. Of the five edges that are not active, i.e., edges 684A–684E, edges 684A–684C are not active since, for the selected to-be-placed macro 664, there is not enough space within floor plan region 680 adjacent these edges for the to-be placed macro to be placed there. However, if the size of to-be-placed macro 664 permits, any one or more of edges 684A–684C may be deemed active. Regarding edges 684D, 684E, these edges are not active because each already abuts macro 672A, and, of course, cannot abut yet another macro. Edge 668F of already-placed macro 672A that already abuts two other already-placed macros 672B, 672C may be deemed active. This is so if in certain orientations, to-be-placed macro 664 can be located between already-placed macros 672A, 672B, as long as compatibility exists between one of the short edges of the to-be-placed macro and the un-abutted segment 688 of edge 668F of already-placed macro 672A. Active edges 668A–668G may be highlighted in some manner, e.g., by using a distinct color and/or lineweight, etc., and/or labeled in some manner, or otherwise be identified as being active. In alternative embodiments, placing sub-module 648 may be configured so that when only a segment of an edge is active, e.g., segment 688 of edge 668F of already-placed macro 672A, only that segment is identified as being active.

Once all of the edges of to-be-placed macro 664 and active edges 668A–668G of already-placed macros 672A–672C have been identified, edge constraint vectorizing sub-module 644 may vectorize the corresponding respective edge constraint definitions of these edges. Placing sub-module 648 may then implement a suitable string-matching algorithm to find all legal locations 692 on active edges 668A–668G of already-placed macros 672A–672C and the corresponding orientation of to-be-placed macro 664. The legal location(s) 692 may be highlighted, labeled or otherwise identified as such. Placing sub-module 648 may also be configured to provide a snap-to feature that allows the user to drag to-be-placed macro 664 to a location proximate one of legal locations 692, and, when the macro is within a predetermined distance from that location cause the to-be-placed macro to snap, i.e., move, into its proper placement and orientation. The above-described steps may continue until all of the desired macros have been placed.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

The invention claimed is:

1. A method of placing a first integrated circuit macro in a floor plan containing at least one second integrated circuit macro, comprising the steps of:
   a) defining edge constraints on at least one edge of the first integrated circuit macro;
   b) defining edge constraints on at least one edge of the second integrated circuit macro;
   c) automatically comparing said edge constraints on said at least one edge of the first integrated circuit macro and said edge constraints on said at least one edge of the second integrated circuit macro with one another; and d) generating a first edge constraint vector corresponding to said at least one edge of the first integrated circuit macro and generating a second edge constraint vector corresponding to said at least one edge of the second integrated circuit macro.

2. A method according to claim 1, wherein step c) includes performing a string searching algorithm.

3. A method according to claim 1, further comprising the step of assigning signatures to said edge constraints of corresponding respective ones of said at least one edge of the first integrated circuit macro and at least one edge of the second integrated circuit macro.

4. A method according to claim 1, further comprising, prior to step a), the step of defining a common unit of measure for use in steps a) and b).

5. A method according to claim 4, wherein each of steps a) and b) includes measuring each of said edge constraints using said common unit of measure.

6. A method according to claim 5, wherein each of steps a) and b) further includes assigning a signature to each unit of measure located within each of said edge constraints.

7. A computer readable medium containing computer executable instructions implementing a method of placing a first integrated circuit macro in a floor plan containing at least one second integrated circuit macro, the instructions comprising:
   a) a first set of instructions for defining edge constraints on at least one edge of the first integrated circuit macro and defining edge constraints on at least one edge of the second integrated circuit macro;
   b) a second set of instructions for comparing said edge constraints on said at least one edge of the first integrated circuit macro and said edge constraints on said at least one edge of the second integrated circuit macro with one another; and
   c) instructions for generating a first edge constraint vector corresponding to said at least one edge of the first integrated circuit macro and generating a second edge constraint vector corresponding to said at least one edge of the second integrated circuit macro.

8. A computer readable medium according to claim 7, wherein said second set of instructions includes instructions for performing a string searching algorithm.

9. A computer readable medium according to claim 7, further comprising instructions for assigning signatures to said edge constraints of corresponding respective ones of said at least one edge of the first integrated circuit macro and at least one edge of the second integrated circuit macro.

10. A computer readable medium according to claim 9, further comprising instructions for measuring each of said edge constraints using a common unit of measure.

11. A computer readable medium according to claim 10, further comprising instructions for assigning a signature to each unit of measure located within each of said edge constraints.

* * * * *